United States Patent
Honda et al.

(10) Patent No.: US 6,246,586 B1
(45) Date of Patent: Jun. 12, 2001

(54) METHOD AND APPARATUS FOR MANUFACTURING A THIN FILM, THIN-FILM LAMINATE, AND ELECTRONIC PARTS

(75) Inventors: Kazuyoshi Honda, Osaka; Noriyasu Echigo; Masaru Odagiri, both of Hyogo; Nobuki Sunagare, Shimane, all of (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 0 days.

(21) Appl. No.: 09/380,911

(22) PCT Filed: Mar. 12, 1998

(86) PCT No.: PCT/JP98/01078

§ 371 Date: Sep. 10, 1999

§ 102(e) Date: Sep. 10, 1999

(87) PCT Pub. No.: WO98/41667

PCT Pub. Date: Sep. 24, 1998

(30) Foreign Application Priority Data

Mar. 19, 1997 (JP) .......................................... 9-65802

(51) Int. Cl.[7] ................. H05K 1/16; B05D 1/02

(52) U.S. Cl. ............... 361/766; 427/81; 427/424; 427/427; 427/480; 205/165; 205/166

(58) Field of Search ............................. 361/766; 427/480, 427/81, 424, 427; 205/165, 166

(56) References Cited

U.S. PATENT DOCUMENTS

| 4,358,349 | * 11/1982 | Masami et al. ..................... 204/15 |
| 5,350,598 | 9/1994 | Kleyer ............................ 427/255.5 |
| 5,962,066 | * 10/1999 | Honda et al. ..................... 427/128 |
| 5,985,423 | * 11/1999 | Honda et al. ..................... 428/212 |

FOREIGN PATENT DOCUMENTS 8-209330    8/1996   (JP) .

* cited by examiner

Primary Examiner—Cathy Lam
(74) Attorney, Agent, or Firm—Merchant & Gould P.C.

(57) ABSTRACT

In a method wherein, before forming a thin film of, for example, metal on a supporting base in a vacuum, a vapor stream of patterning material for forming a pattern in the thin film is applied from nozzle holes, and the thin film is formed after this liquid has been adhered onto the supporting base, the patterning material is applied from the nozzle holes in such manner that it unifies on the supporting base. Thus, even when the pattern width is enlarged, a pattern can be formed in which the blurring at the pattern edges is small.

11 Claims, 14 Drawing Sheets

METHOD AND APPARATUS FOR MANUFACTURING A THIN FILM, THIN-FILM LAMINATE, AND ELECTRONIC PARTS

BACKGROUND OF THE INVENTION

1. Field of the Invention

The present invention relates to a method and an apparatus for manufacturing a thin film used, for example, for electronic components. The present invention also relates to a product of layered thin films and an electronic component using the same.

2. Description of the Prior Art

In our modern society, thin films play a role in various fields, and are used, for example, in wrapping paper, magnetic tapes, capacitors, semiconductors and other everyday products.

Without such thin films, the fundamental trends of technology in recent years, which are higher performance and miniaturization, would not have been possible. At the same time, there have been various developments with regard to methods for forming thin films to satisfy industrial needs, for example, towards continuous vacuum vapor deposition while winding that is useful for high-speed mass production, and which can be applied to wrapping paper, magnetic tapes, capacitors, etc.

A thin film with the desired characteristics can be formed by selecting the evaporation material and the substrate material in accordance with the purpose of the thin film to be formed, and forming a thin film while a potential is applied to the substrate, while introducing a reactive gas into a vacuum if necessary. For example, an oblong magnetic recording medium can be obtained by using an evaporation material including a magnetic element such as Co, Ni, or Fe to manufacture the magnetic recording medium, and performing reactive vapor deposition while introducing an oxide gas into the vacuum container.

Moreover, on semiconductors, thin films are mainly formed by sputtering. Sputtering is also particularly useful for the formation of thin films using materials based on ceramics, and often ceramic thin films with several $\mu$m or more thickness are formed by coating and firing, and those of 1 $\mu$m or less thickness are formed by sputtering.

On the other hand, methods based on coating with paint are used to form thin films using resin materials, and reverse coating and die coating are used industrially, and it is common to dry and harden the material, which has been diluted with a solvent, after the coating step. Moreover, the lower limit of the film thickness for resin films formed with these processes depends on the used material. Often, the film thickness is about 1 $\mu$m, and often film thicknesses below that are difficult to obtain.

In usual coating means, dilution with a solvent is necessary for the formation of ultra-thin resins films in order to achieve a thickness of the coating directly after the coating that is at least several $\mu$m thick, but often it is not possible to obtain resin thin films of 1 $\mu$m or less. Moreover, when dilution is performed with a solvent, defects occur easily in the coating film after the coating, and it is further not preferable with regard to environmental protection.

Therefore, there is a need for a method with which a resin thin film can be formed without dilution with a solvent, and for a method with which ultra-thin resin thin films can be obtained reliably. As a method solving these problems, it has been proposed to form a resin thin film in a vacuum.

In this method, a resin material is vaporized in a vacuum, and then adhered to a supporting base. With this method, a resin film without void defects can be formed, and dilution with a solvent is not necessary.

By depositing thin films of a different kind on a ceramic thin film or on a resin thin film, several composite thin films that could not be obtained conventionally can be obtained, and the fields for their industrial application are extremely diverse. Among these, chip-shaped electronic parts are in high demand, and capacitors, coils, resistors, capacitive batteries and components that are combinations of these can be formed in extremely small sizes and with high performance by layering thin films, and are already included in products and their market expansion has begun.

Needless to say, electrodes are indispensable for obtaining electronic components, but in electronic components using metal thin films, metal thin films with different potentials can be formed in an electronic component by subjecting the metal thin films to patterning. This means that an electronic component can be formed by using pattern portions as insulating regions to divide a metal thin film into a plurality of metal thin films, and layering such layers alternately with insulating thins films.

Electronic components with multi-layers of patterned metal thin films and insulating thin films can be formed with the apparatus outlined in FIG. 2. In FIG. 2, a source 8 for forming a metal thin film, a source 9 for forming an insulating thin film, a curing apparatus 10, and an apparatus 11 for applying patterning material are arranged around a can 7 for supporting a layered film. The can 7 rotates with constant velocity in the arrow direction and a product of layered thin films is formed on the peripheral surface of the can 7, having a number of thin films that corresponds to the number of rotations of the can 7. These are arranged inside a vacuum container 5, whose interior is maintained at a vacuum or at low pressure with an evacuation system 6 including, for example, a vacuum pump.

For the source 8 for forming a metal thin film, a resistance-heating vapor source, an inductance-heating vapor source, an electron beam vapor source, a sputtering vapor source, a cluster vapor source, or any other device used for forming a thin film or any combination thereof can be used, in accordance with the metal thin film to be formed.

For the source 9 for forming an insulating thin film, an apparatus for vaporization by heating with a heater or vaporization or atomization with ultrasonic waves or spraying a resinous material, or sputtering a ceramic-based material, or sputtering, vapor deposition etc. of an oxide can be used, in accordance with the insulating thin film to be formed.

The curing apparatus 10 cures the insulating thin film formed with the source 9 for forming an insulating thin film to a predetermined hardness. For the curing apparatus 10, UV curing, electron curing, heat curing, or a combination thereof can be used if a resin thin film is used for the dielectric.

As a method for obtaining a patterned metal thin film, there is an approach called "oil margin". This involves forming a metal thin film by vapor deposition or the like after thinly applying a thin patterning material, and using the fact that the metal thin film is not formed on the patterning material. A method that can be used for applying patterning material in a vacuum is heating a patterning material that is enclosed in a nozzle having micro-aperture portions (nozzle holes) in accordance with the pattern, and spraying a vapor of that material from the nozzle holes, which condenses on the surface where a metal thin film is to be formed.

For the patterning material, an oil, or any other material that is suitable for patterning a metal thin film can be used. The thusly formed metal thin film is formed at all portions except where the patterning had been formed, so that it is possible to form a metal thin film having the desired pattern.

FIG. 3 is an example of the structure of a metal thin film formed on the peripheral surface of the can 7. FIG. 3 shows a partial development along the peripheral surface of the can 7. The arrow 70 in this drawing indicates the travel direction of the peripheral surface of the can 7. In the example in FIG. 3, several band-shaped metal thin films 1 that are divided by the pattern positions 4 are formed on the peripheral surface of the can.

With the apparatus in FIG. 2, a product of layered thin films is obtained on the peripheral surface of a can 7 by alternately layering a metal thin film patterned as shown in FIG. 3 and an insulating thin film on the peripheral surface of the can 7. Next, this layered product is cut in the layering direction. The relation between the pattern position and the cutting position is set appropriately. Then, an electronic component can be manufactured by forming electrodes by thermal spraying or the like if necessary.

FIG. 4 is a cross-sectional view showing an outline of the internal structure of an electronic component that can be used as a capacitor. In the electronic component in FIG. 4, an insulating thin film 2 and a metal thin film 1 are layered alternately and each metal thin film 1 is divided into two at the pattern position 4. In the electronic component in FIG. 4, the pattern position 4 of each metal thin film differs from the pattern position 4 of the next metal thin film above or below, and matches the pattern position 4 of the metal thin film after that. With the apparatus in FIG. 2, this can be realized by shifting the patterning position back and forth for a predetermined distance parallel to the rotation axis of the can 7 once for each rotation of the can 7. In the electronic component in FIG. 4, electrodes 3 are formed on two opposing side surfaces of a layered product as described above, which are electrically connected to the metal thin films 1. Thus, the electronic component in FIG. 4 functions as a capacitor with the insulating thin films 2 as the dielectric.

To perform the patterning with oil margins with great accuracy, the patterning material has to be applied very precisely. Examples for parameters that influence the pattern width are the properties of the patterning material, the nozzle temperature, the gap between the nozzle holes and the supporting base to which the patterning material is applied, and the size of the nozzle holes. Especially if marks due to contact between the nozzles and the supporting base cause problems, it is necessary to keep a small gap between the nozzles and the supporting base. The pattern width becomes larger, the larger the nozzle holes are and the larger the gap between the nozzle holes and the supporting base is, but if the pattern width is increased like this, the edges of the pattern become blurry. Therefore, there is a need for a patterning method wherein the edges do not blur, even when the pattern width becomes large.

DISCLOSURE OF INVENTION

It is an object of the present invention to provide a method and an apparatus for manufacturing a thin film, which can form a pattern without blurring at the pattern edges even when the pattern width is increased, while maintaining the necessary gap between the nozzles and the supporting base. Moreover, it is an object of the present invention to provide a product of layered thin films and an electronic component without blurring at the pattern edges, even when the pattern width is formed as wide as necessary.

The present invention achieves these objects with the following configuration.

In accordance with the present invention, a method for manufacturing a thin film, wherein a thin film is formed on a supporting base in a vacuum, and before the formation of said thin film, a patterning material for forming a pattern in said thin film is applied, whereafter said thin film is formed, is characterized in that said thin film is formed after applying said patterning material in vapor streams from a plurality of nozzle holes, and unifying liquids of said vapor streams on said supporting base. With this configuration, a thin film can be manufactured with large pattern width, and at the same time little blurring at the pattern edges. Consequently, a thin film with excellent patterning properties can be obtained, and it is possible to obtain a product of layered thin films that can be used for a high-performance electrical component, for which a high-performance capacitor is an example.

In this configuration, it is preferable that a distance between said plurality of nozzle holes in a direction of a pattern width of said thin film is not more than the pattern width of said thin film divided by the number of said nozzle holes. With this configuration, the liquid of the vapor streams from a plurality of nozzles can be unified reliably on the supporting base. Consequently, a pattern without inner gaps can be formed.

In this configuration, it is preferable that a fluorine-containing oil, a mineral oil, or a linear alkane, which is fluid at room temperature, is used as a main component of said patterning material. With such a material, it is easy to control the formation of the vapor streams and their liquefaction on the supporting base. Moreover, the wettability of the non-adhering surface is good, and so is the heat-resistance when the metal thin films are formed. Consequently, the blurring at the pattern edges is low, and a good pattern can be formed reliably.

An apparatus for manufacturing a thin film in accordance with the present invention comprises a vacuum container; a supporting base inside said vacuum container; an apparatus for forming a thin film on said supporting base; an apparatus for applying a patterning material on said supporting base before the formation of said thin film, in order to form a pattern in said thin film; characterized in that said apparatus for applying a patterning material has a plurality of nozzle holes for spraying a vapor of patterning material on said supporting base; and said nozzle holes are arranged in a manner that said patterning material sprayed from at least two of said nozzle holes forms one pattern on said supporting base.

Another apparatus for manufacturing a thin film in accordance with the present invention comprises a vacuum container; a supporting base inside said vacuum container; an apparatus for forming a thin film on said supporting base; an apparatus for applying a patterning material on said supporting base before the formation of said thin film, in order to form a pattern in said thin film; and a mechanism for moving said supporting base relatively to said apparatus for applying a patterning material, characterized in that said apparatus for applying a patterning material has a nozzle hole for spraying a vapor of patterning material on said supporting base; and the shape of said nozzle hole is oblong in a direction perpendicular to the direction in which said supporting base moves relatively.

Another apparatus for manufacturing a thin film in accordance with the present invention comprises a vacuum container; a supporting base inside said vacuum container; an apparatus for forming a thin film on said supporting base; an apparatus for applying a patterning material on said supporting base before the formation of said thin film, in order to form a pattern in said thin film; and a mechanism for moving said supporting base relatively to said apparatus for applying a patterning material, characterized in that said apparatus for applying a patterning material has a nozzle hole for spraying a vapor of patterning material on said supporting base; and the shape of said nozzle hole has a linear section parallel to the direction in which said supporting base moves relatively.

Another apparatus for manufacturing a thin film in accordance with the present invention comprises a vacuum container; a supporting base inside said vacuum container; an apparatus for forming a thin film on said supporting base; an apparatus for applying a patterning material on said supporting base before the formation of said thin film, in order to form a pattern in said thin film; and a mechanism for moving said supporting base relatively to said apparatus for applying a patterning material, characterized in that said apparatus for applying a patterning material has a nozzle hole for spraying a vapor of patterning material on said supporting base; and the shape of said nozzle hole has a constriction portion wherein an aperture width of the nozzle hole is narrower in a direction parallel to the direction in which said supporting base moves relatively, provided in a central portion of the aperture width in a direction perpendicular to the direction in which said supporting base moves relatively.

Another apparatus for manufacturing a thin film in accordance with the present invention comprises a vacuum container; a supporting base inside said vacuum container; an apparatus for forming a thin film on said supporting base; an apparatus for applying a patterning material on said supporting base before the formation of said thin film, in order to form a pattern in said thin film; and a mechanism for moving said supporting base relatively to said apparatus for applying a patterning material, characterized in that said apparatus for applying a patterning material has a nozzle hole for spraying a vapor of patterning material on said supporting base; and the shape of said nozzle hole has a linear section parallel to the direction in which said supporting base moves relatively, and has a constriction portion wherein an aperture width of the nozzle hole is narrower in a direction parallel to the direction in which said supporting base moves relatively, provided in a central portion of the aperture width in a direction perpendicular to the direction in which said supporting base moves relatively.

With the configuration of any of these manufacturing apparatuses, it is possible to manufacture a thin film with little blurring at the pattern edges, even when the pattern width is large. Consequently, a thin film with excellent patterning properties can be obtained, and it is possible to obtain a product of layered thin films that can be used for a high-performance electrical component, for which a high-performance capacitor is an example.

In accordance with the present invention, a product of layered thin films wherein a thin film layer in which a pattern is formed and another thin film layer different from said thin film layer are layered is characterized in that a distance D0 in a direction of the width of said pattern between points of said pattern where the transmitted amount of light is 50% of the transmitted amount of light in a central portion of the pattern is at least 300 $\mu$m, and a distance D1 in a direction of the width of said pattern between a point at an edge of said pattern where the transmitted amount of light is 20% of the transmitted amount of light in a central portion and a point at an edge of said pattern where the transmitted amount of light is 80% of the transmitted amount of light in a central portion is not more than $\frac{1}{5}$ of said D0. With this configuration, a product of layered thin films with large pattern width and, at the same time, little blurring at the pattern edges can be provided.

Moreover, an electronic component in accordance with the present invention is made by forming electrodes on the above-noted product of layered thin films. In other words, an electronic component with excellent electrical properties and reliable quality can be provided, because it uses a product of layered thin films in which the pattern width is large and at the same time there is little blurring at the pattern edges.

In this configuration, it is preferable that the thin film layer in which the pattern is formed is a metal thin film layer, the electronic component comprises at least two of said metal thin film layers, and functions as a capacitor. In this preferable configuration, the borders between the regions where the metal thin film layers serving as electrodes oppose each other and function as a capacitor and the insulating portions where no electrodes are formed become clear, so that the volume of the insulating portions can be made relatively small, the portions effectively operating as a capacitor can be made large, and the electrodes are formed with uniform thickness up to the edge portions, so that the portions of the electrode portions with large film resistance can be made small, which is useful with regard to characteristics such as the tan $\delta$ (dielectric loss), moisture resistance, etc.

DESCRIPTION OF THE PREFERRED EMBODIMENTS

The following is a description of the preferred embodiments, with reference to the accompanying drawings.

Figure 5:
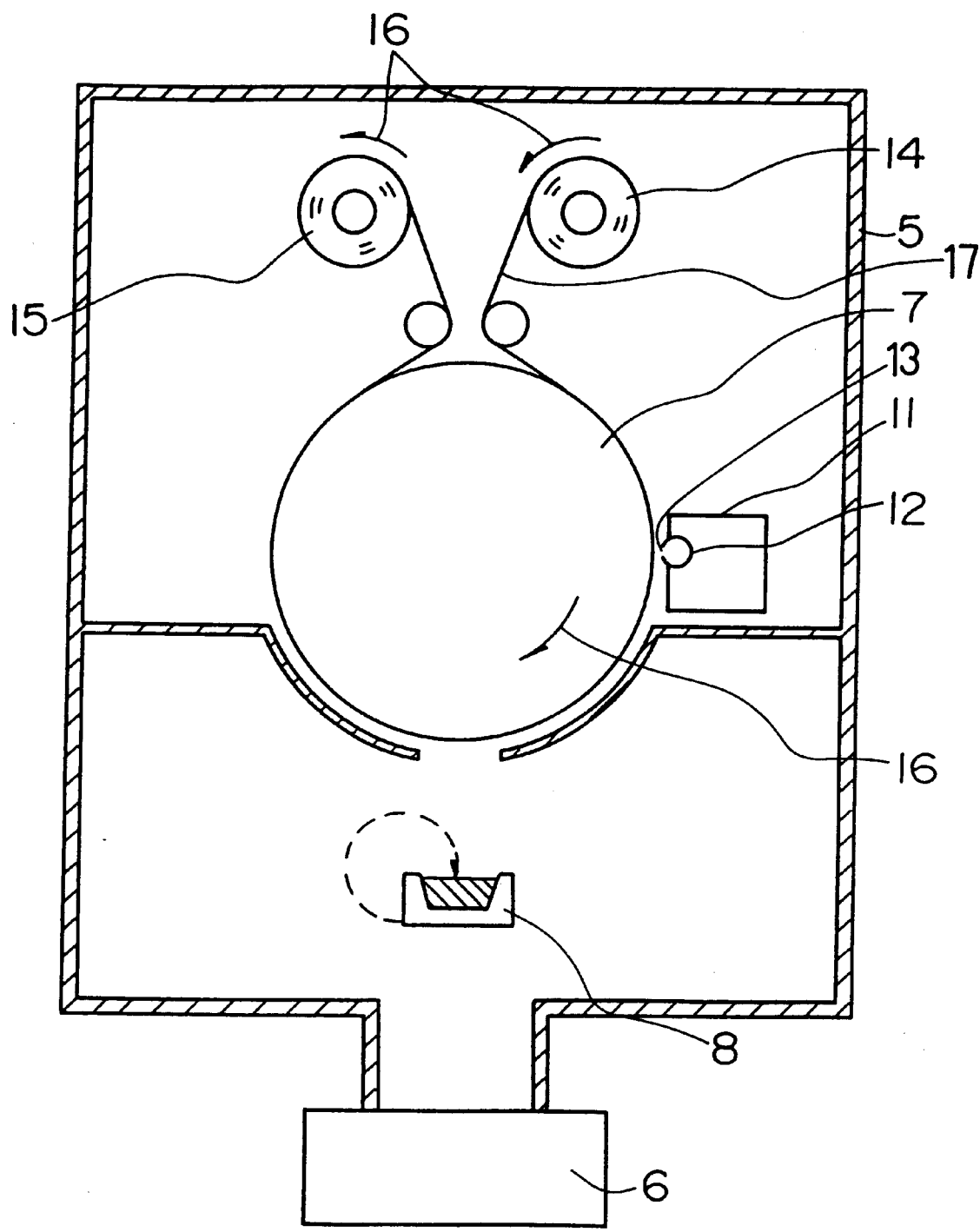
FIG. 5 is a diagram showing the internal configuration of an apparatus for forming a patterned metal thin film on an oblong polymer substrate.

FIG. 5 is a cross-sectional view schematically illustrating the internal configuration of an apparatus for forming thin films used in the following examples. A long polymer substrate 17 is conveyed in the travel direction 16 around the perimeter of a can 7, which rotates at constant speed. The polymer substrate 17 is unwound from an unwinding roll 14, passes the can 7 and is wound onto the winding roll 15. An apparatus 11 for applying a patterning material is arranged on a side of the can 7. The apparatus 11 for applying a patterning material includes a nozzle 12 for heating and evaporating patterning material, and nozzle holes 13 for spraying the patterning material vapor that has been vaporized inside the nozzle 12 onto the polymer substrate 17. A source 8 for forming a conductive thin film, serving as a thin film formation apparatus, is arranged below the can 7. In the apparatus in FIG. 5, the source 8 for forming a conductive thin film includes a metal evaporation device. The source 8 for forming a conductive thin film forms a metal thin film on the polymer substrate 17, to which the patterning material has been adhered. Aluminum was used for the evaporation metal. The above-noted components are arranged in a vacuum container 5, in whose inside a vacuum is maintained with an evacuation system 6 including a vacuum pump 6. There is no particular limitation regarding the vacuum degree, and a vacuum wherein the adhering of the patterning material and the metal evaporation can be performed well is sufficient. In the following examples, the vacuum degree was set to $2 \times 10^{-4}$ Torr. Moreover, the travelling speed of the substrate was set to 100m/min, and the nozzle temperature was adjusted so that the formed pattern was clearest and the least blurry. This temperature was generally 140° C.–220° C.

In the following examples, the effect of the present invention is explained for the case that a patterning thin film is formed on a long polymer substrate, so that the patterning can be understood easily, but the present invention also can be applied to cases wherein many layers of a metal thin film and an insulating thin film are formed on a polymer substrate, or a multi-layered product of metal and insulating thin films is formed with the method shown in FIG. 2.

EXAMPLE 1

To make the patterning easily understandable, a metal thin film was patterned on a long polymer substrate 17 running around the can 7 shown in FIG. 5, and the resulting patterning was examined. An evaporated thin film of aluminum with a thickness of 50 nm was used for the metal thin film.

Figure 6:
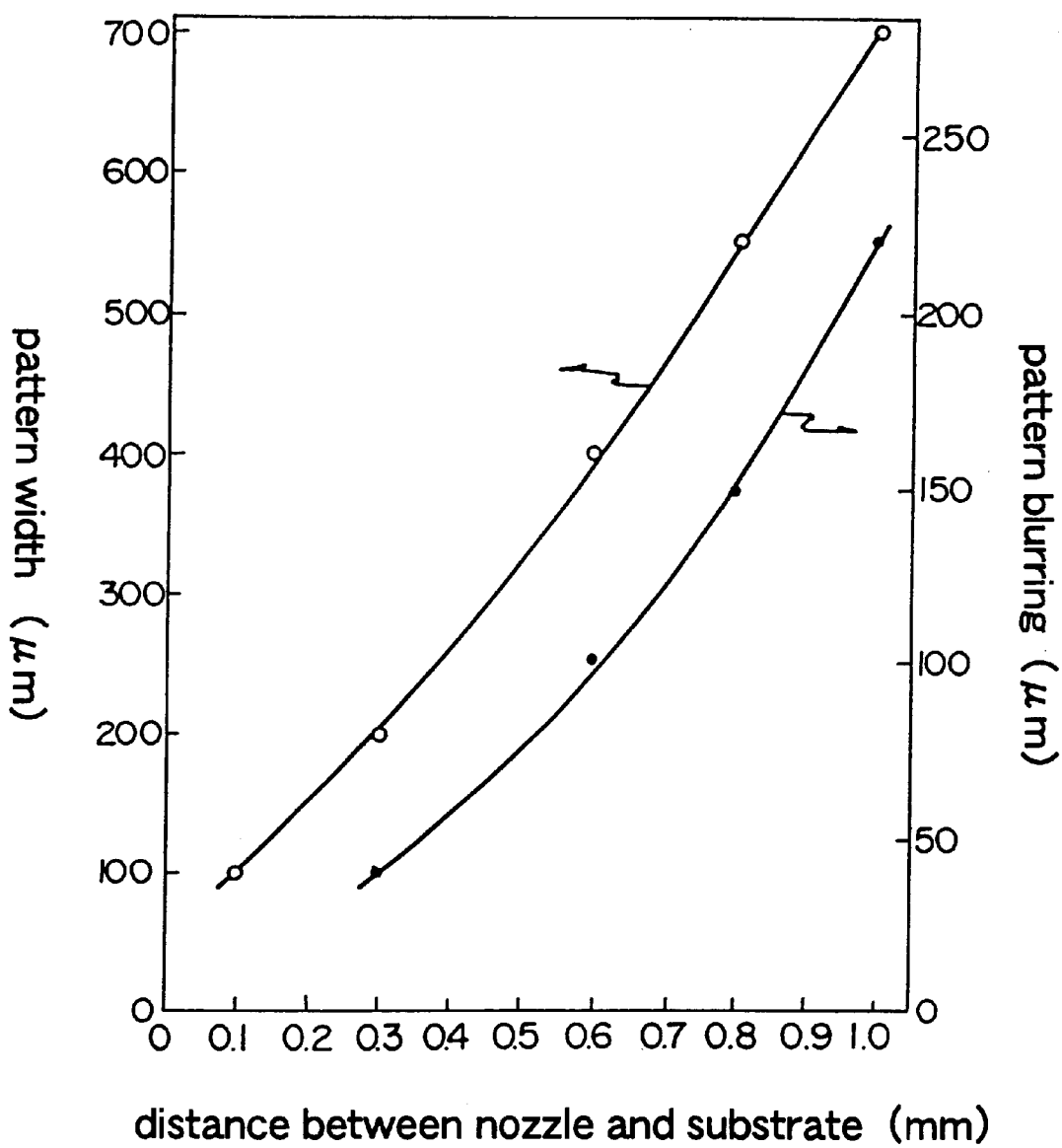
FIG. 6 is a graph illustrating the dependence of the pattern width and the pattern blurring upon the distance between the nozzles and the polymer substrate.

The diameter of the nozzle holes 13 provided in the nozzle 12 used for the patterning was set to 50 $\mu$m, and the pattern width and the blurring of the pattern edges were examined for different gaps of 0.1 to 1 mm between the nozzle holes 13 and the polymer substrate. A fluorine-containing oil was used for the patterning material. A laser beam with a diameter of 10 $\mu$ was used to examine the transmitted amount of light near the pattern. Designating 100 as the transmitted amount of light at a central portion of the pattern where a metal thin film has not been formed, the distance in the direction of the pattern width from a transmitted amount of light of 20 to a transmitted amount of light of 80 was determined to evaluate the extent of the blurring. The pattern width was defined as the width where the transmitted amount of light on both sides becomes 50. The results are shown in FIG. 6. In FIG. 6, the white circles ("○") indicate the pattern width, and the black circles ("●") indicate the pattern blurring.

As can be seen in FIG. 6, the greater the gap between the nozzle holes and the polymer substrate is, the larger becomes the pattern width and blurring, and to make a large pattern width, it is not preferable to choose a large gap between the nozzle holes and the substrate, because of this blurring.

Figure 7:
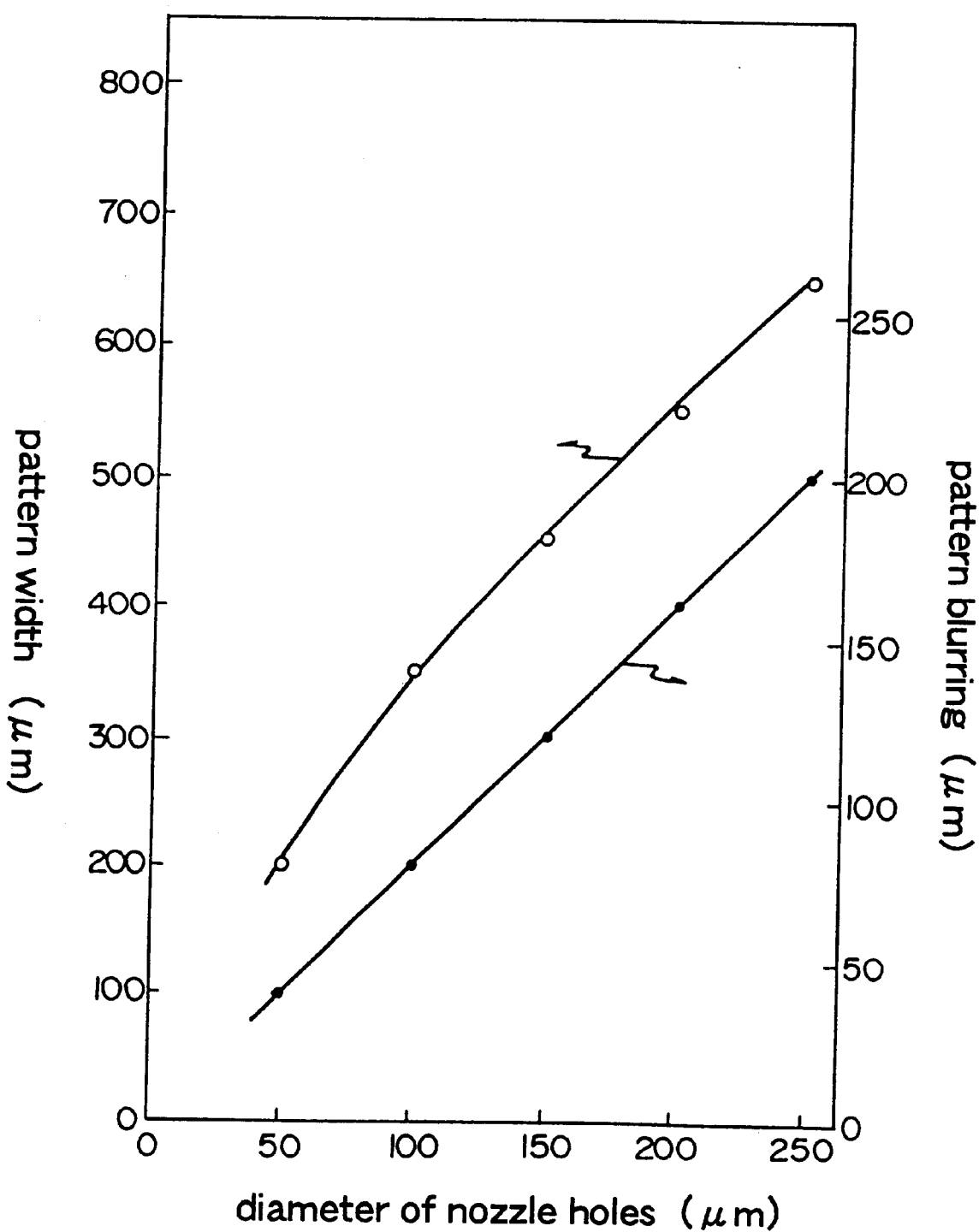
FIG. 7 is a graph illustrating the dependence of the pattern width and the pattern blurring upon the diameter of the nozzle holes.

Next, the gap between the nozzle holes 13 and the polymer substrate was set to 0.3 mm, and the pattern width and the blurring at the pattern edges were examined for different diameters of nozzle holes ranging from 50 to 250 $\mu$m. The results are shown in FIG. 7. In FIG. 7, the white circles ("○") indicate the pattern width, and the black circles ("●") indicate the pattern blurring.

As can be seen in FIG. 7, the larger the nozzle holes are, the larger is the pattern width that is attained, but for large pattern widths, the blurring increases as well.

Figure 1:
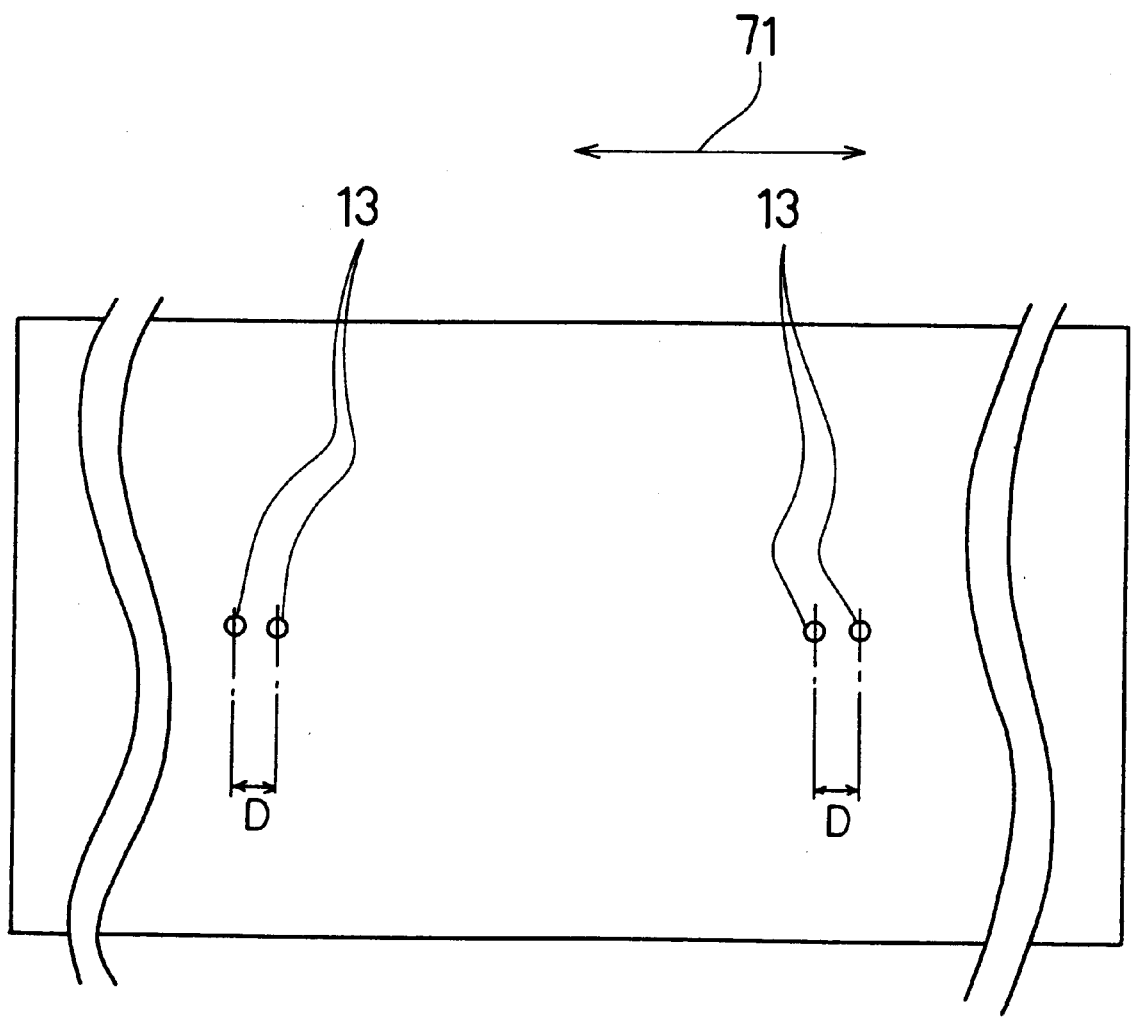
FIG. 1 is a schematic drawing showing an example of the shape of nozzle holes in accordance with the present invention.
Figure 8:
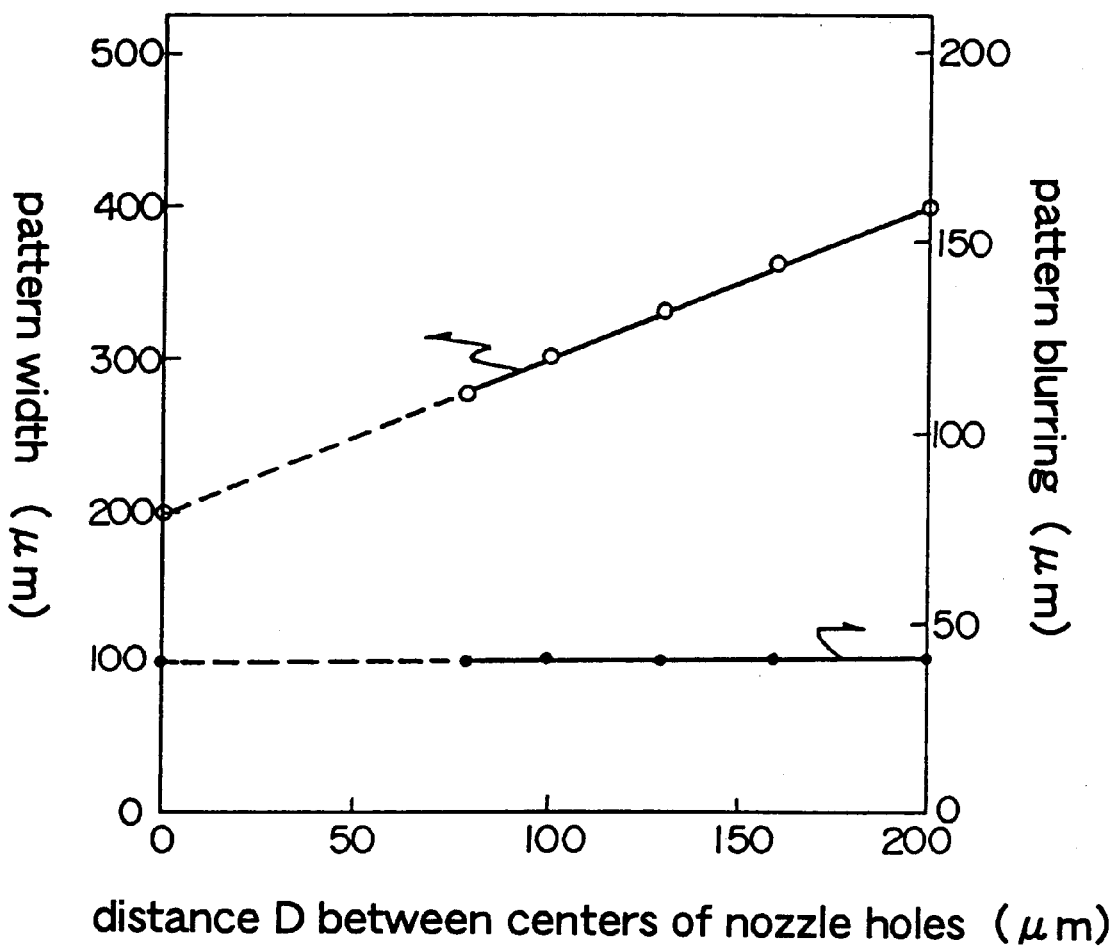
FIG. 8 is a graph illustrating the dependence of the pattern width and the pattern blurring upon the distance between two holes arranged next to each other.

Then, the gap between the nozzle holes 13 and the polymer substrate was set to 0.3 mm, two nozzle holes 13 of 50 $\mu$m diameter were placed next to each other in the direction of the pattern width, as shown in the schematic drawing in FIG. 1, and the pattern width and the blurring were examined for different distances D between the centers of the two nozzle holes 13. FIG. 1 is a magnification of the nozzle portion of the apparatus for applying a patterning material, and the arrow 71 indicates the direction of the width of the formed pattern. The results are shown in FIG. 8. In FIG. 8, the white circles ("○") indicate the pattern width, and the black circles ("●") indicate the pattern blurring.

As can be seen in FIG. 8, when the distance D between the two holes becomes larger, the pattern width becomes larger as well, but the blurring stays the same. When the distance between the holes exceeded 210 $\mu$m, 10 the pattern eventually broke up in two, so under these conditions, the distance D between the holes should be kept lower than 210 $\mu$m. When the distance between the holes at which the pattern breaks up in two was examined, it turned out that the pattern breaks up in two when the distance between the holes exceeds ½ the pattern width.

Moreover, it was found that when three or more nozzle holes were lined up near each other, the pattern blurring was the same as in the case for two nozzle holes, but the formed pattern width could be made even larger. Also in this case, when the distance between the nozzle holes was too large, the pattern started to break up into three or more patterns. A pattern that did not break up into several patterns could be formed when the distance between the holes was not more than the pattern width divided by the number of nozzle holes.

Thus, it was found that if a plurality of nozzle holes are lined up in the direction of the pattern width, and a homogenous pattern was formed with this plurality of nozzle holes, a pattern having the necessary width can be formed without deterioration due to pattern blurring. Moreover, considering the break-up of the pattern, it is preferable that the distance between the nozzle holes is not more than the pattern width divided by the number of nozzle holes.

EXAMPLE 2

Figure 9:
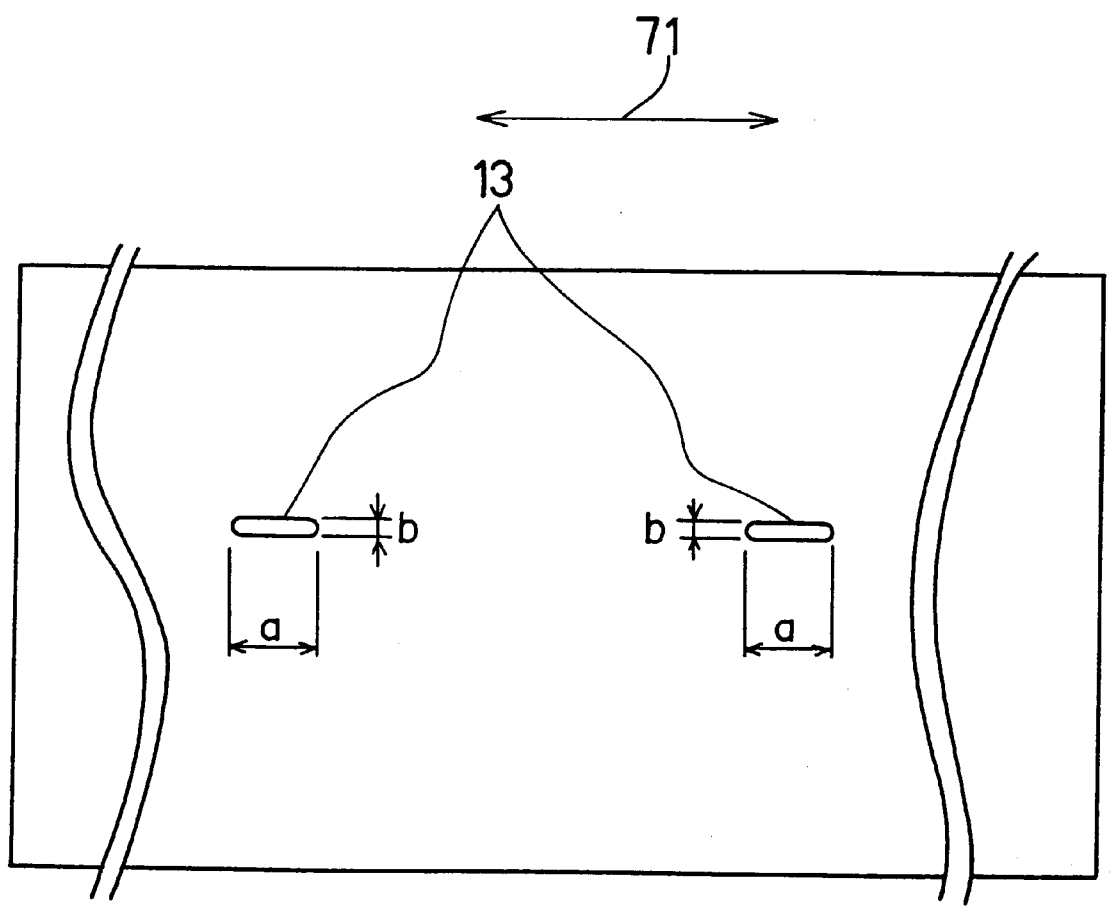
FIG. 9 is a schematic drawing illustrating an example of the shape of a nozzle used in the present invention, which is oblong in the direction of the pattern width.
Figure 10:
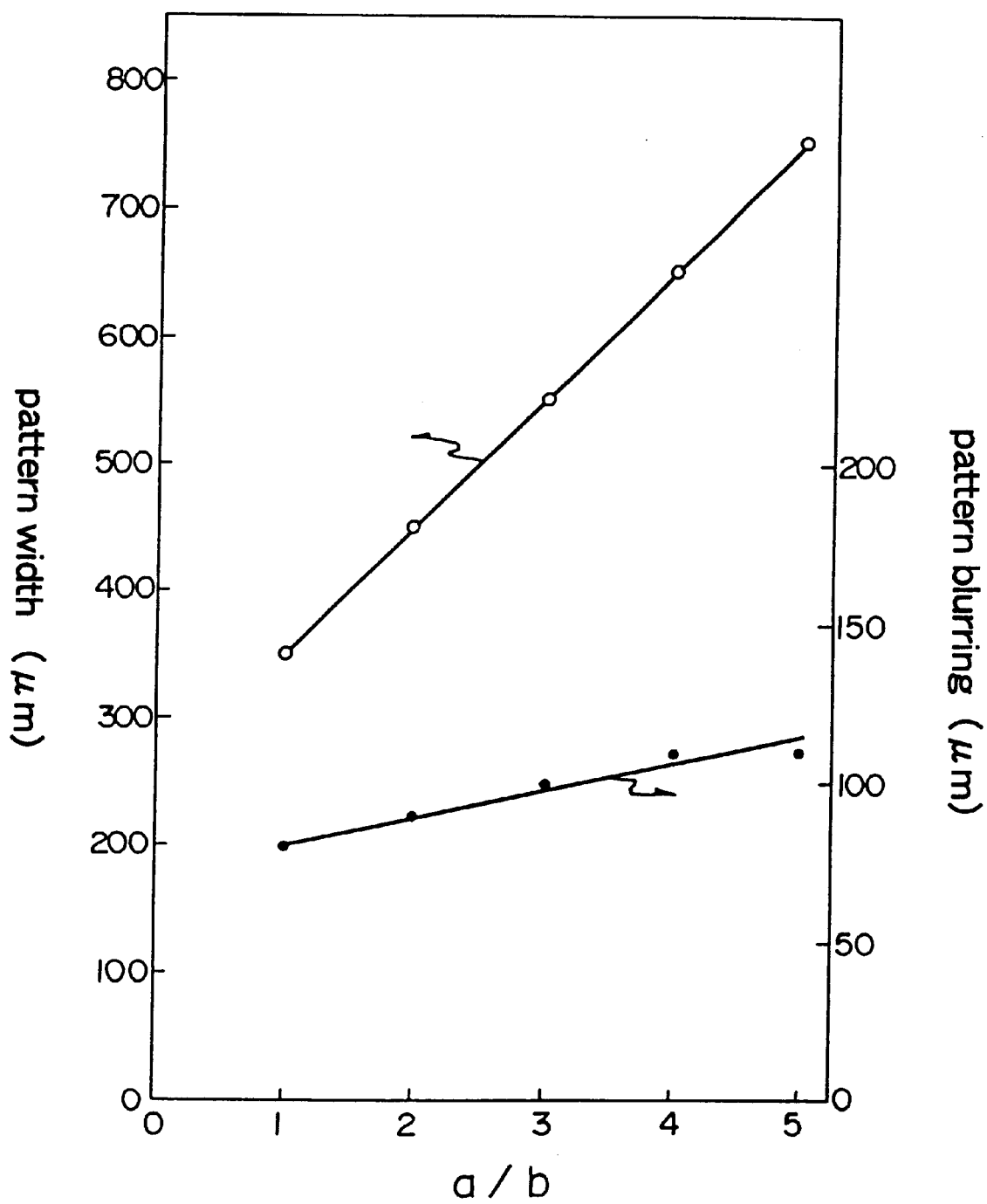
FIG. 10 is a graph illustrating the dependence of the pattern width and the pattern blurring upon the shape of the nozzle holes that are oblong in the direction of the pattern width.

A pattern was formed on a polymer substrate, as in Example 1. As shown in FIG. 9, the shape of the nozzle holes 13 is oblong in the direction 71 of the pattern width. Let a be the aperture width of the nozzle holes 13 in the direction of the pattern width, and b be the aperture width of the nozzle holes 13 in the direction perpendicular to the pattern width (that is, in the travel direction of the polymer substrate). The gap between the polymer substrate and the nozzle holes was set to 0.3 mm, and the pattern width and blurring were examined for different ratios a/b, ranging from 1 to 5, with a and b as shown in FIG. 9. The value of b was set to 100 $\mu$m. The results are shown in FIG. 10. In FIG. 10, the white circles ("○") indicate the pattern width, and the black circles ("●") indicate the pattern blurring.

As can be seen in FIG. 10, by providing the nozzle holes with a shape that is oblong in the direction of the pattern width, the pattern width becomes larger, but the blurring stays almost the same.

EXAMPLE 3

Figure 11:
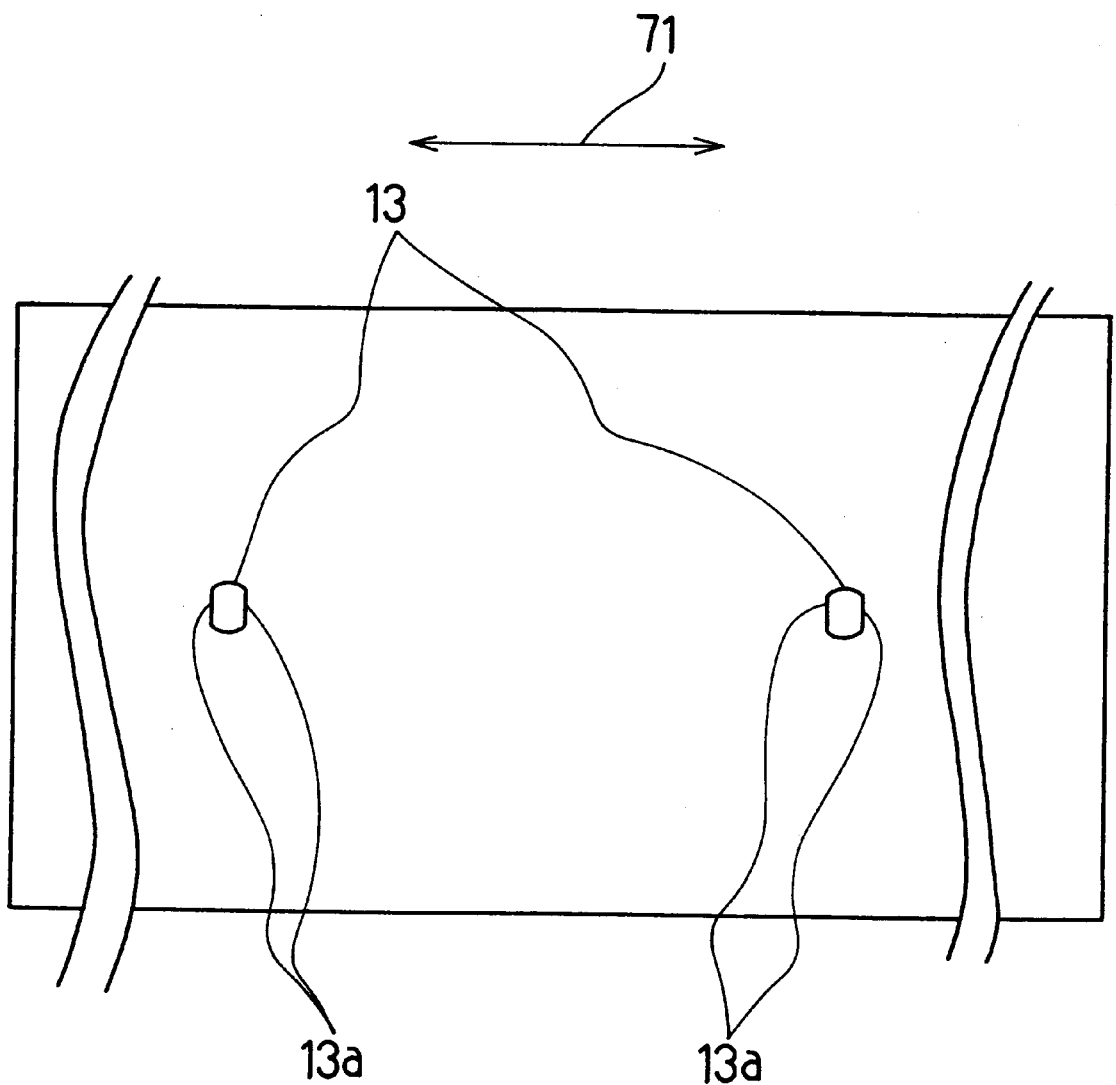
FIG. 11 is a schematic drawing showing an example of the shape of a nozzle hole used in the present invention, which is linear at the edges in the direction of the pattern width.
Figure 12:
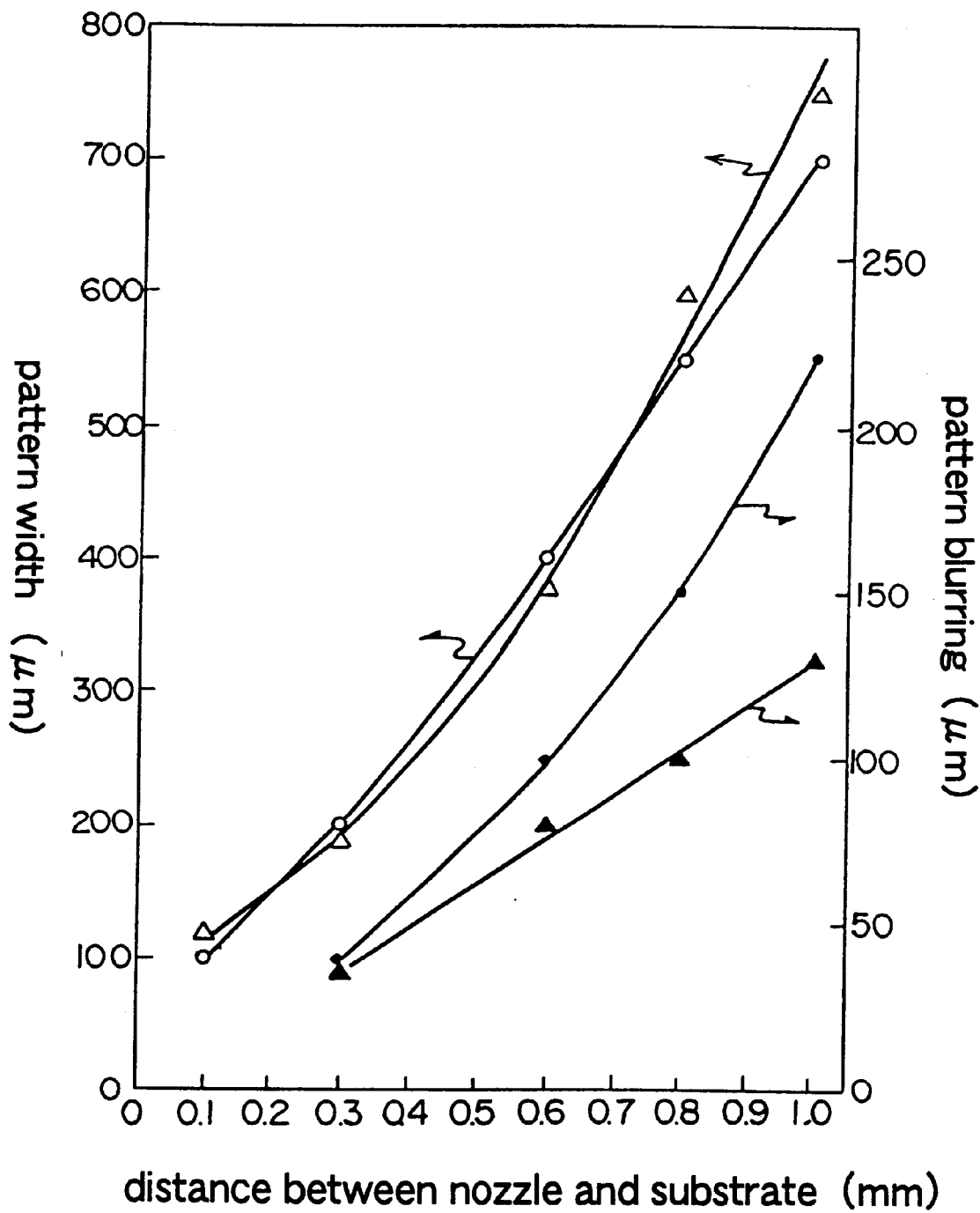
FIG. 12 is a graph illustrating the dependence of the pattern width and the pattern blurring upon the gap between the nozzle holes and the substrate, when the edge portions of the nozzle holes in the direction of the pattern width are linear.

Next, the pattern blurring when the shape of the nozzle holes is circular was compared to the blurring when the edges of the nozzle holes in the direction of the pattern width are linear, as indicated in FIG. 11. The nozzle holes 13 shown in FIG. 11 have linear portions (line segments) 13a that are perpendicular to the direction 71 of the pattern width (that is, parallel to the travel direction of the polymer substrate) on both sides of the aperture portions. The aperture width of the holes in the direction of the pattern width was set to 50 $\mu$m, and the pattern width and the pattern blurring were examined for different gaps between the nozzles and the substrate, ranging from 0.1 to 1 mm. The result is shown in FIG. 12. In FIG. 12, the white circles ("○") and the black circles ("●") both illustrate the results for the circular nozzle holes, and indicate the pattern width and the pattern blurring, respectively. On the other hand, the white triangles ("Δ") and the black triangles ("▲") both illustrate the results for the nozzle holes shaped as shown in FIG. 11, and indicate the pattern width and the pattern blurring, respectively.

As can be seen in FIG. 12, by providing the aperture portions of the nozzle holes with the shape shown in FIG. 11, the pattern width stays almost he same, but the blurring becomes smaller.

EXAMPLE 4

Next, the pattern formed with circular holes was compared to the patterns formed when the nozzle holes had the shape of dumbbells, as shown FIG. 13(a), or of constricted near-rectangles, as shown in FIG. 13(b). The dumbbell-shaped nozzle holes in FIG. 13(a) include two round less with diameter c arranged near each other in the direction 71 of the pattern width, which are connected by a constriction portion of a width "d" that is smaller than the diameter of the two round holes. The aperture width in the direction of the pattern width is "e". On the other hand, the nozzle holes shaped like constricted near-rectangles in FIG. 13(b) have an aperture width "e" in the direction of the pattern width, an aperture width c in the direction perpendicular to the pattern width (that is, the travel direction of the polymer substrate), and a constriction portion in the middle with respect to the direction of the pattern width, which has an aperture width "d" that is smaller than the aperture width "c". Moreover, the corners of the aperture portions are beveled to arcs as shown in the drawing.

Figure 13:
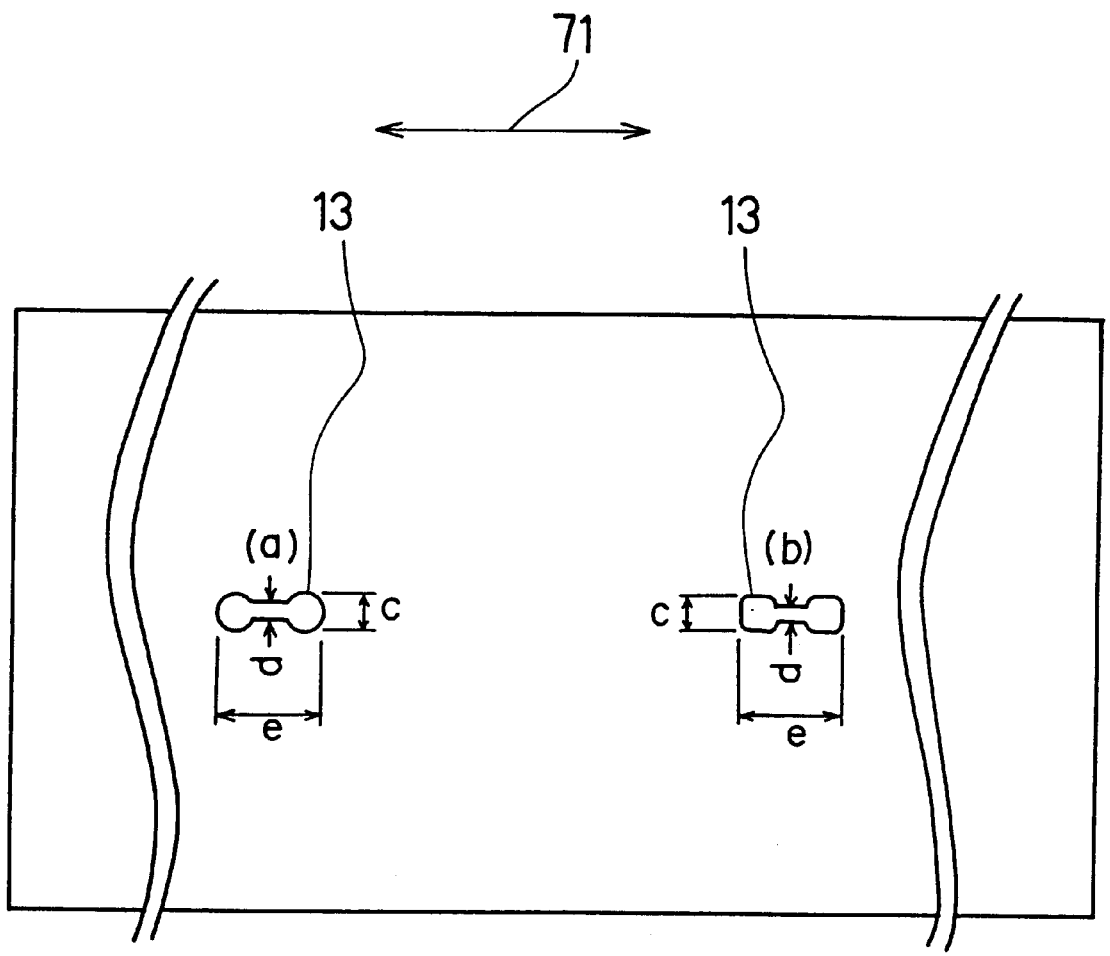
FIG. 13 is a schematic drawing showing an example of shapes of nozzle holes used in the present invention, which have a constriction.
Figure 14:
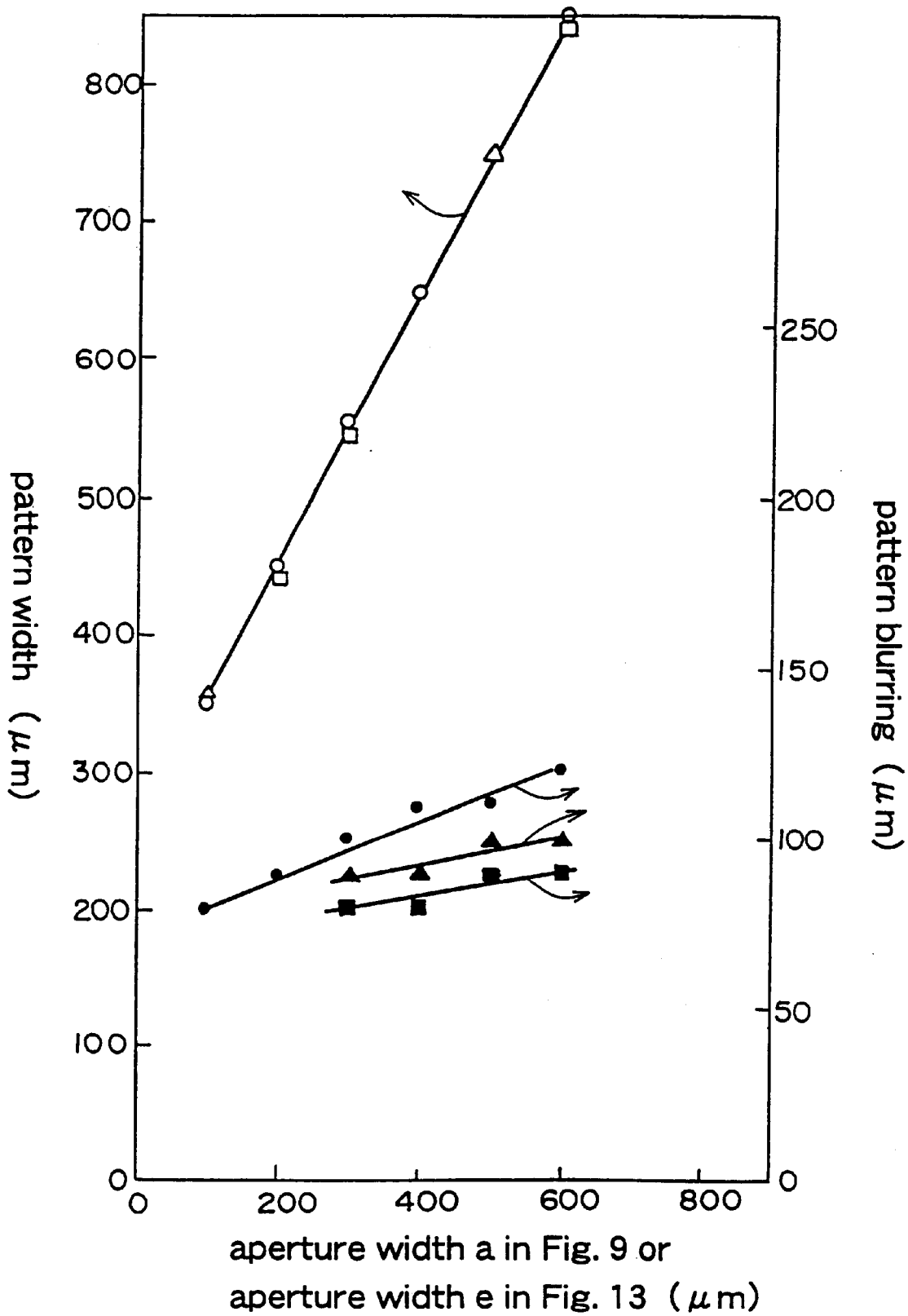
FIG. 14 is a graph illustrating the dependence of the pattern width and the pattern blurring upon the shape of the nozzle holes with constrictions.

The aperture width c in the direction perpendicular to the pattern width (that is, the travel direction of the polymer substrate) in FIG. 13 was set to 100 $\mu$m, the aperture width d of the constriction portion was set to 50 $\mu$m, patterns were formed with different aperture widths e in the direction of the pattern width, and the relation between e and the formed pattern width and pattern blurring was examined. The results are shown in FIG. 14. FIG. 14 also shows the results for the case that h of the nozzle holes in FIG. 9 was set to 100 $\mu$m, and a was varied. The gap between the nozzle holes and the substrate was in all cases 0.3 mm. In FIG. 14, the white circles ("○") and the black circles ("●") both illustrate the results for the nozzle holes shown in FIG. 9, and indicate the pattern width and the pattern blurring, respectively. The white triangles ("Δ") and the black triangles ("▲") both illustrate the results for the dumbbell-shaped nozzle holes shaped shown in FIG. 13(a), and indicate the pattern width and the pattern blurring, respectively. The white squares ("□") and the black squares ("■") both illustrate the results for the nozzle holes shaped like constricted near-rectangles, as shown in FIG. 13(b), and indicate the pattern width and the pattern blurring, respectively.

As can be seen in FIG. 14, if the aperture width in the direction of the pattern width is the same, the formed pattern width is for nozzle holes of all three kinds of aperture shapes substantially the same. On the other hand, for the same pattern width, the blurring for the nozzle holes shaped like constricted near-rectangles shown in FIG. 13(b) was smaller than the blurring for the dumbbell-shaped nozzle holes shaped shown in FIG. 13(a), which in turn was smaller than the blurring for the nozzle holes shown in FIG. 9. In other words, also with constricted shapes as shown in FIGS. 13(a) and (b), it is possible to control the blurring that accompanies increased pattern widths.

Figure 4:
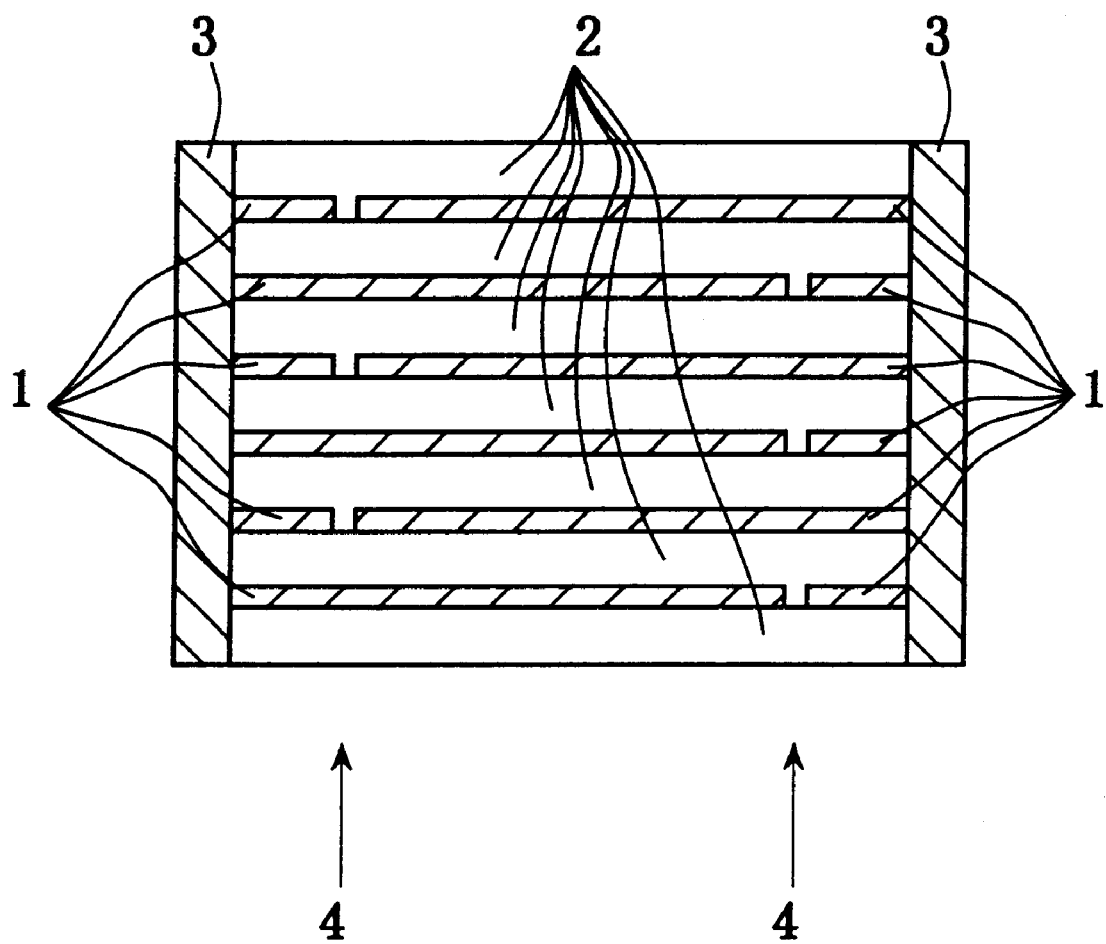
FIG. 4 is a diagram showing an example of a cross-section of an electronic component.

The reason why the Examples 1 to 4 could reduce the blurring that accompanies increased pattern widths is believed to be as follows: If the hole diameter and the gap between the nozzle holes and the substrate is simply enlarged to enlarge the pattern width, the vapor stream of the patterning material strays apart, and the pattern blurs out. On the other hand, with the method of Example 1, which uses a plurality of holes, two or more vapor streams with sharp distribution can be overlapped in the direction of the pattern width, and the pattern width can be enlarged, while suppressing deterioration due to pattern blurring. Moreover, increasing the hole diameter also widens the vapor stream, and by providing the holes with a shape that is oblong in the direction of the pattern width, as in Example 2, it is possible to reduce the area of the aperture of the holes with respect to the spraying width, so that imprecisions in the vapor stream due to the widening of the evaporation spray can be suppressed. In the case of circular nozzle holes, the vapor distribution adhering on the substrate reflects the circular arc on the pattern edges and becomes smooth, but if the shape of the holes is linear at the edges in the direction of the pattern width as in Example 3, the distribution of the vapor adhering to the substrate rises more sharply at the edges in the direction of the pattern width, so that the blurring of the pattern can be reduced. With even broader hole shapes, one might expect that more patterning material adheres in the center and less at the edges, because the vapor stream with such broader hole shapes can be likened to the overlapping of vapor streams from small holes. However, if the nozzle holes are provided with constrictions, as shown in FIG. 4, the overlapping vapor streams will have a distribution that is comparatively flat in the width direction, which improves the blurring at the pattern edges. Moreover, if the nozzle holes are nearly rectangular as in Example 4 (FIG. 13(b)), they have the same linear portions (line segments) as in Example 3 at the edges in the direction of the pattern width, so that the effect of the constriction is added to the effect of the linear portion, and the pattern blurring can be suppressed even better.

The above examples have been explained for the case that a fluorine-containing oil is used for the patterning material, but the same effect also can be attained if a mineral oil or a hydrocarbon-based oil, such as decane or dodecane, is used for the patterning material, and it can be assumed that there are no particular restrictions with regard to the patterning material used for the present invention.

Moreover, the above example have been explained for the case that aluminum is used for the metal thin film layer. However, just by changing the nozzle temperature and the patterning material, for example, it is also possible to use other metals, such as copper, silver, nickel, or zinc, or alloys thereof.

Moreover, Examples 1 to 4 have been explained for the case that a polymer substrate is used for the supporting base. However, there is no restriction regarding the supporting base in the present invention, and it is also possible to use supporting bases with flat shapes or other curved shapes besides the circular shape.

Figure 2:
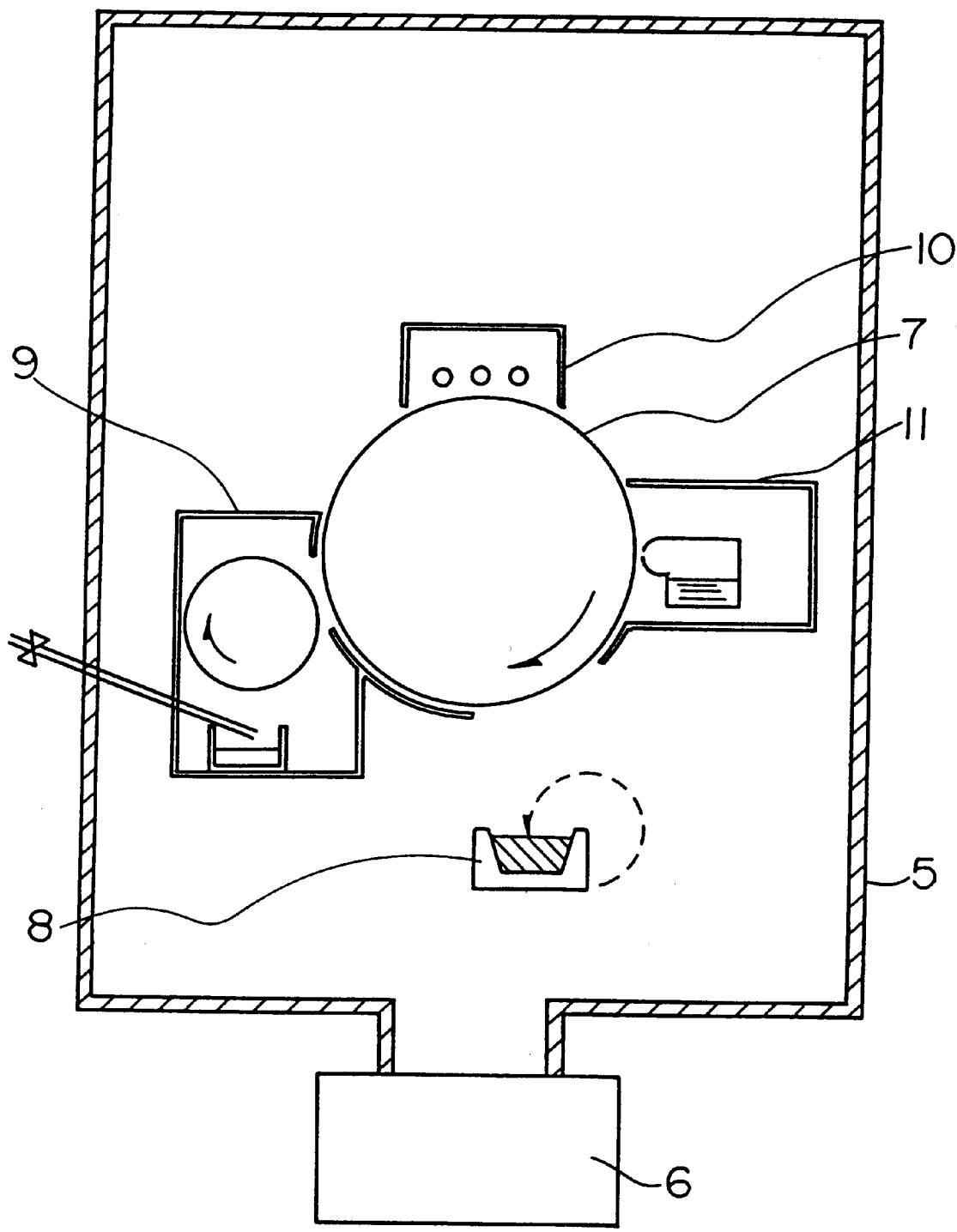
FIG. 2 is a diagram showing an example of the internal configuration of a layering apparatus for manufacturing a multi-layer product with patterned layers of metal thin films and insulating thin films.
Figure 3:
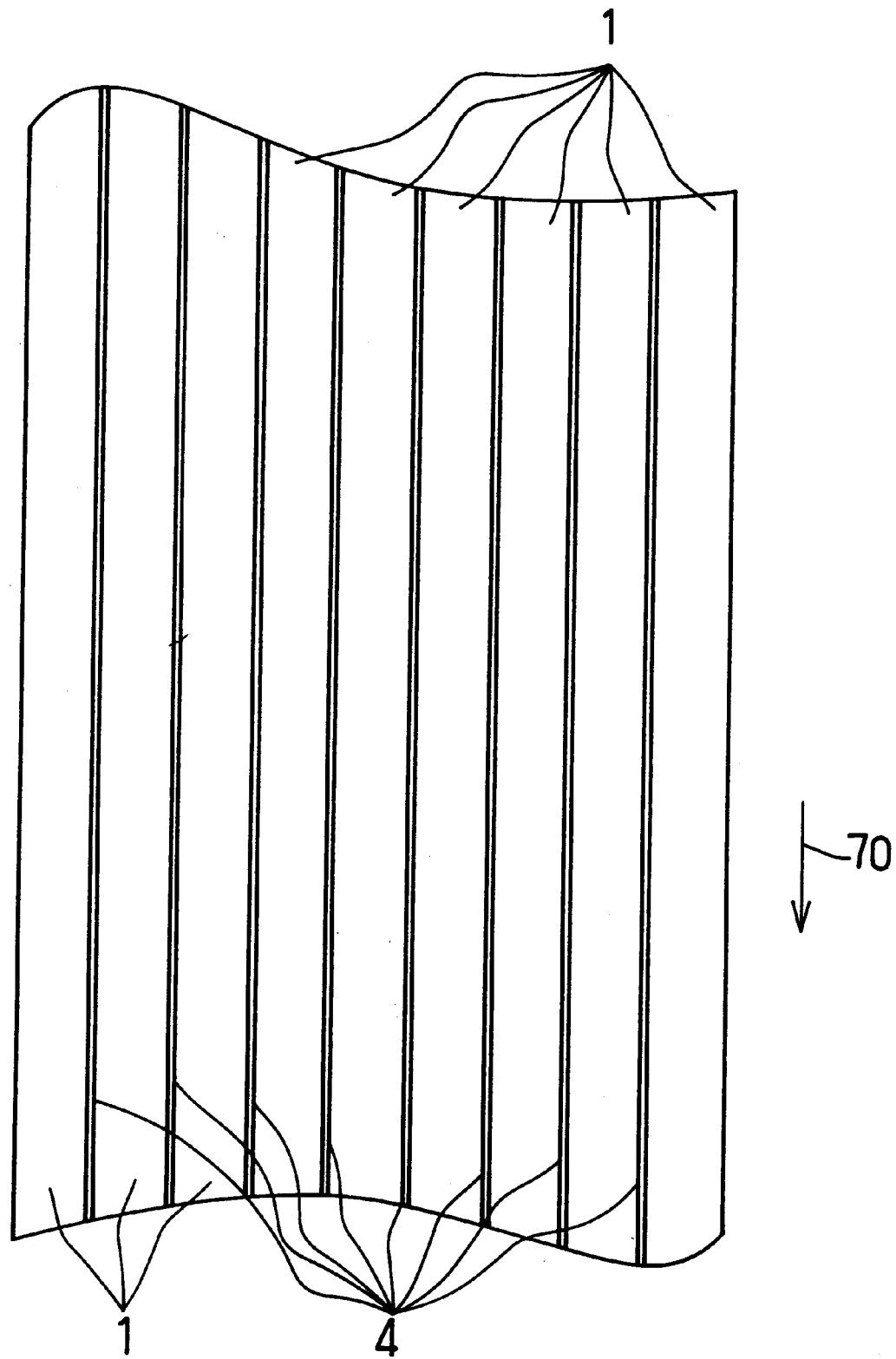
FIG. 3 is a development elevation showing an example of a patterned metal thin film formed on the perimeter of a can.

As an application example for the present invention, the capacitor whose cross-sectional configuration shown in FIG. 4 can be formed using an apparatus as shown in the diagram of FIG. 2, as mentioned before. The distance between the nozzle holes of the apparatus 11 for applying a patterning material and the can 7 is controlled, and a resin thin film and a patterned metal thin film are formed directly on the can while switching the patterning position. If the present invention is applied to the capacitor, the opposing electrode portions and the insulating portions become clearer, the volume of the insulating portions can be made comparatively small, so that the portions operating as a capacitor can be made larger. Also, that the portions of the electrodes with a large film resistance can be reduced is very useful with regard to the tan δ (dielectric losses), moisture resistance, etc.

Moreover, the above examples have been explained for metal thin films serving as electrodes, but the improvement of the patterning characteristics attained with the present invention is not limited to metal thin films, but can be applied to thin films in general, for example to metal oxide thin films or other insulating thin films, to semiconductor thin films, etc., and the industrial applicability for the method and apparatus for producing a thin film is very broad.

The invention may be embodied in other specific forms without departing from the spirit or essential characteristics thereof. The embodiments disclosed in this application are to be considered in all respects as illustrative and not restrictive, the scope of the invention being indicated by the appended claims rather than by the foregoing description, all changes that come within the meaning and range of equivalency of the claims are intended to be embraced therein.

INDUSTRIAL APPLICABILITY

With the method and the apparatus for manufacturing a thin film according to the present invention, it is possible to obtain a thin film with large pattern width and only little blurring at the pattern edges. Consequently, the method and the apparatus for manufacturing a thin film according to the present invention can be used in various kinds of fields in which a patterned thin film is manufactured. They can be applied to thin films in general, that is to metal thin films, of course, but also to metal oxide thin films and other insulating thin films, to semiconductor thin films, etc.

Furthermore, a product of layered thin films of the present invention can be applied broadly to layered thin films that should be patterned in general, and can in particular be used for an electronic component. If it is used for a capacitor whose patterned metal thin films serve as the electrodes, a capacitor can be obtained that is small, has high capacity, and excellent electrical properties, such as an excellent tan δ. Moreover, there are many fields to which the present invention can be applied, including for example coils, resistors, capacitive batteries, and combinations thereof.

What is claimed is:

1. A method for manufacturing a thin film, wherein a thin film is formed on a supporting base in a vacuum, and before the formation of said thin film, a patterning material for forming a pattern in said thin film is applied, whereafter said thin film is formed, the method being characterized in that said thin film is formed after applying said patterning material in vapor streams from a plurality of nozzle holes, and unifying liquids of said vapor streams on said supporting base.

2. The method according to claim 1, characterized in that a distance between said plurality of nozzle holes in a direction of a pattern width of said thin film is not more than the pattern width of said thin film divided by the number of said nozzle holes.

3. The method according to claim 1, characterized in that a fluorine-containing oil, a mineral oil, or a linear alkane, which is fluid at room temperature, is used as a main component of said patterning material.

4. An apparatus for manufacturing a thin film, the apparatus comprising a vacuum container; a supporting base inside said vacuum container; an apparatus for forming a thin film on said supporting base; an apparatus for applying a patterning material on said supporting base before the formation of said thin film, in order to form a pattern in said thin film; characterized in that said apparatus for applying a patterning material has a plurality of nozzle holes for spraying a vapor of patterning material on said supporting base; and said nozzle holes are arranged in a manner that said patterning material sprayed from at least two of said nozzle holes forms one pattern on said supporting base.

5. An apparatus for manufacturing a thin film, the apparatus comprising a vacuum container; a supporting base inside said vacuum container; an apparatus for forming a thin film on said supporting base; an apparatus for applying a patterning material on said supporting base before the formation of said thin film, in order to form a pattern in said thin film; and a mechanism for moving said supporting base relative to said apparatus for applying a patterning material, characterized in that said apparatus for applying a patterning material has a nozzle hole for spraying a vapor of patterning material on said supporting base; and the shape of said nozzle hole is oblong in a direction perpendicular to the direction in which said supporting base moves relatively.

6. An apparatus for manufacturing a thin film, the apparatus comprising a vacuum container; a supporting base inside said vacuum container; an apparatus for forming a thin film on said supporting base; an apparatus for applying a patterning material on said supporting base before the formation of said thin film, in order to form a pattern in said thin film; and a mechanism for moving said supporting base relatively to said apparatus for applying a patterning material, characterized in that said apparatus for applying a patterning material has a nozzle hole for spraying a vapor of patterning material on said supporting base; and the shape of said nozzle hole has a linear section parallel to the direction in which said supporting base moves relatively.

7. An apparatus for manufacturing a thin film, the apparatus comprising a vacuum container; a supporting base inside said vacuum container; an apparatus for forming a thin film on said supporting base; an apparatus for applying a patterning material on said supporting base before the formation of said thin film, in order to form a pattern in said thin film; and a mechanism for moving said supporting base relatively to said apparatus for applying a patterning material, characterized in that said apparatus for applying a patterning material has a nozzle hole for spraying a vapor of patterning material on said supporting base; and the shape of said nozzle hole has a constriction portion wherein an aperture width of the nozzle hole is narrower in a direction parallel to the direction in which said supporting base moves relatively, provided in a central portion of the aperture width in a direction perpendicular to the direction in which said supporting base moves relatively.

8. An apparatus for manufacturing a thin film, the apparatus comprising a vacuum container; a supporting base inside said vacuum container; an apparatus for forming a thin film on said supporting base; an apparatus for applying a patterning material on said supporting base before the formation of said thin film, in order to form a pattern in said thin film; and a mechanism for moving said supporting base relatively to said apparatus for applying a patterning material, characterized in that said apparatus for applying a patterning material has a nozzle hole for spraying a vapor of patterning material on said supporting base; and the shape of said nozzle hole has a linear section parallel to the direction in which said supporting base moves relatively, and has a constriction portion wherein an aperture width of the nozzle hole is narrower in a direction parallel to the direction in which said supporting base moves relatively, provided in a central portion of the aperture width in a direction perpendicular to the direction in which said supporting base moves relatively.

9. A product of layered thin films wherein a thin film layer in which a pattern is formed and another thin film layer different from said thin film layer are layered, characterized in that a distance $D0$ in a direction of the width of said pattern between points of said pattern where the transmitted amount of light is 50% of the transmitted amount of light in a central portion of the pattern is at least 300 $\mu$m, and a distance $D1$ in a direction of the width of said pattern between a point at an edge of said pattern where the transmitted amount of light is 20% of the transmitted amount of light in a central portion and a point at an edge of said pattern where the transmitted amount of light is 80% of the transmitted amount of light in a central portion is not more than $\frac{1}{5}$ of said $D0$.

10. An electronic component, made by forming electrodes on the product of layered thin films according to claim 9.

11. The electronic component according to claim 10, wherein the thin film layer in which the pattern is formed is a metal thin film layer, the electronic component comprises at least two of said metal thin film layers, and which functions as a capacitor.

* * * * *